(12) United States Patent
Chen et al.

(10) Patent No.: US 12,543,609 B2
(45) Date of Patent: Feb. 3, 2026

(54) COMMON CATHODE ELECTRODE STRUCTURE FOR VERTICAL LED PIXEL PACKAGE

(71) Applicant: EXCELLENCE OPTO. INC., Miaoli County (TW)

(72) Inventors: Fu-Bang Chen, Miaoli County (TW); Chang-Hung Pan, Miaoli County (TW); Tzeng-Guang Tsai, Miaoli County (TW); Kuo-Hsin Huang, Miaoli County (TW)

(73) Assignee: EXCELLENCE OPTO. INC., Miaoli County (TW)

( * ) Notice: Subject to any disclaimer, the term of this patent is extended or adjusted under 35 U.S.C. 154(b) by 375 days.

(21) Appl. No.: 18/362,503

(22) Filed: Jul. 31, 2023

(65) Prior Publication Data

US 2025/0046767 A1 Feb. 6, 2025

(51) Int. Cl.
*H01L 25/075* (2006.01)
*H01L 25/16* (2023.01)
*H10H 20/819* (2025.01)
*H10H 20/822* (2025.01)
*H10H 20/83* (2025.01)

(52) U.S. Cl.
CPC ........ *H01L 25/0756* (2013.01); *H01L 25/167* (2013.01); *H10H 20/819* (2025.01); *H10H 20/822* (2025.01); *H10H 20/83* (2025.01)

(58) Field of Classification Search
CPC . H01L 25/0756; H01L 25/167; H10H 20/819; H10H 20/822; H10H 20/83; H10H 29/0362; H10H 29/854; H10H 29/853; H10H 29/857; H10H 29/49
See application file for complete search history.

(56) References Cited

U.S. PATENT DOCUMENTS

| | | | |
|---|---|---|---|
| 2021/0167266 A1* | 6/2021 | Ikeda | G09F 9/30 |
| 2022/0278255 A1* | 9/2022 | Zhang | H10H 20/857 |
| 2022/0375913 A1* | 11/2022 | Templier | H10H 20/018 |
| 2024/0170625 A1* | 5/2024 | Liu | H10H 29/142 |

* cited by examiner

*Primary Examiner* — Mark W Tornow
(74) *Attorney, Agent, or Firm* — MUNCY, GEISSLER, OLDS & LOWE, P.C.

(57) ABSTRACT

A common cathode electrode structure for vertical LED pixel package, includes a package carrier, vertical LED chips, a conductive column, an insulating isolation support, and a common cathode metal thin film layer. The vertical LED chips are arranged above package carrier, the package carrier includes anodes and a common cathode penetrating therethrough to be external connection point. The anodes are respectively corresponded and electrically connected to P electrodes of the vertical LED chips, and the conductive column is electrically connected to common cathode and N electrodes of vertical LED chips. The common cathode metal thin-film layer is formed on vertical LED chips, conductive column and insulating isolation support to electrically conduct the conductive column and the N electrodes. The anodes and common cathode are in the same plane, which can meet the requirements for embodying SMT for small-spacing LED display module.

12 Claims, 16 Drawing Sheets

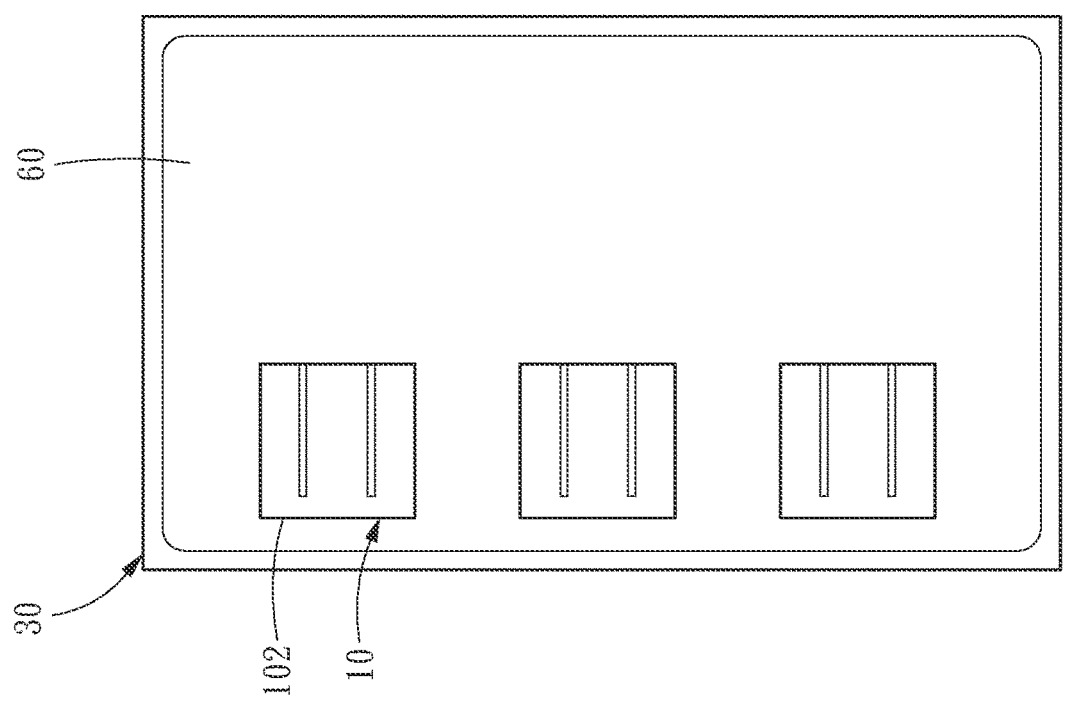

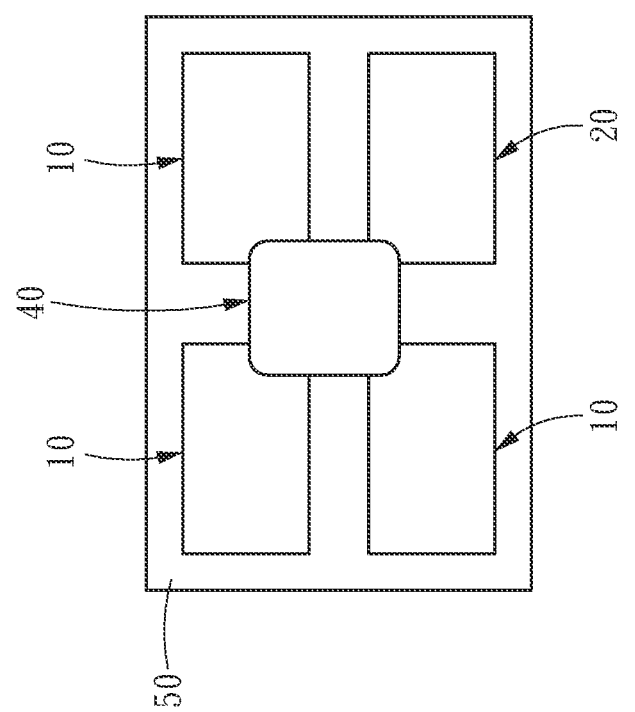

COMMON CATHODE ELECTRODE STRUCTURE FOR VERTICAL LED PIXEL PACKAGE

FIELD OF THE INVENTION

The present invention relates to a package element structure using a vertical light-emitting diode chip, and more particularity, to a common cathode electrode structure for a vertical LED pixel package.

BACKGROUND OF THE INVENTION

A LED chip may be mainly classified into three types: 1. horizontal, 2. vertical, and 3. flip-chip, according to its appearance, electrode arrangement, and current direction in a semiconductor layer.

A horizontal LED chip and a vertical LED chip are the simplest chip aspect, but their electrodes and package carriers are electrically connected, so that both of them need to use a wire bonding manufacturing process. Referring to FIGS. 1A and 1B, as shown, a schematic top view of a wire bonding structure and a schematic sectional side view of a wire bonding structure of a vertical LED are shown. The vertical LED has a package carrier 1, with a blue LED chip 2, a green LED chip 3, and a red LED chip 4 being arranged on the package carrier 1. The N electrodes 5 of the blue LED chip 2, the green LED chip 3, and the red LED chip 4 are electrically connected to a common cathode pad 7 via a metal wire bonding 6, respectively. The efficiency of a manufacturing process of the structure is low, and there is a reliability problem that a wafer may be damaged due to a wire bonding manufacturing process.

In order to avoid the above wire bonding problem, the LED display screen using a flip-chip LED chip which does not need wire bonding plays a dominant role now.

With a manufacturing process of the electrical connection between a flip-chip LED chip and a package carrier, a P electrode and an N electrode thereof both adopt a conductive mode of bottom adhesion without connecting an electrode above a light-emitting plane in a wire bonding mode. The N electrode and the P electrode at the bottom of the lower part of the chip are conductively adhered to the package carrier by an electrode pad, so that the drawbacks of a wire bonding manufacturing process can be avoided.

As for a LED display screen with a smaller pixel pitch, such as a pixel pitch smaller than 0.75 mm, its pixel package requires the red, green, and blue light-emitting diode chips with smaller size, such as a chip smaller than 125 μm*125 μm. At this time, the small size flip-chip LED chip is prone to the risk of short circuit at the bottom, because both the N electrode and the P electrode are arranged at the bottom of the chip to conductively adhere to the package carrier, which is usually embodied with a conductive solder paste. As the chip size becomes smaller and smaller, the P electrode and the N electrode in the same plane at the bottom of the flip-chip LED chip becomes closer and closer, so that it is easy to form an immediate short circuit or cause a long time reliability failure due to the diffusion of conductive substances in the manufacturing process of the precision metal adhesion.

SUMMARY OF THE INVENTION

The main object of the present invention is to disclose a common cathode electrode structure for a vertical LED pixel package, in which a vertical light-emitting diode chip and a package carrier are electrically connected, without a metal wire bonding, to avoid the drawbacks that the current mainstream small-size flip-chip LED chips are prone to short circuit in a packaging manufacturing process due to too small spacing between electrodes in the same plane of the chip, so that it is beneficial to the mass production and manufacturing of the MiniLED Display with high contrast and high frame quality of high reliability.

The present invention proposes a common cathode electrode structure for a vertical light-emitting diode pixel package, including a package carrier, a plurality of vertical light-emitting diode chips, a conductive column, an insulating isolation support, and a common cathode metal thin film layer.

The package carrier includes a plurality of anodes and a common cathode, and the plurality of anodes and the common cathode respectively penetrating through the package carrier. The plurality of vertical light-emitting diode chips are arranged on the package carrier, the plurality of vertical light-emitting diode chips respectively including a conductive carrier, a vertical light-emitting diode structure, an N electrode, and a P electrode. The vertical light-emitting diode structure is fixed on the conductive carrier, the N electrode 13 is electrically connected to an upper part of the vertical light-emitting diode structure, and the P electrode is electrically connected to a lower part of the conductive carrier. The plurality of anodes are respectively corresponded and electrically connected to the P electrodes of the plurality of vertical light-emitting diode chips.

The conductive column is arranged on the package carrier and electrically connected to the common cathode, and a common plane is formed between the N electrodes of the plurality of vertical light-emitting diode chips and an upper contact surface of the conductive column.

The insulating isolation support is arranged on the package carrier and filled between the conductive column and the plurality of vertical light-emitting diode chips and flushed with the common plane, the insulating isolation support covering a side wall of the plurality of vertical light-emitting diode chips. The common cathode metal thin film layer is formed on the N electrodes of the plurality of vertical light-emitting diode chips, the conductive column, and the insulating isolation support, and the common cathode metal thin film layer is electrically conducted with the conductive column and the N electrodes of the plurality of vertical light-emitting diode chips.

Accordingly, the present invention disposes the common cathode metal thin film layer and the conductive column to electrically connect the plurality of N electrodes to the common cathode of the package carrier, and arranges the plurality of P electrodes electrically connect to the plurality of anodes of the package carrier respectively, and the plurality of anodes and the common cathode are in the same plane. The present invention proposes a design of a common cathode. When the vertical light-emitting diode chips of red, green, and blue constitute a single pixel, the luminous intensity of each of the vertical light-emitting diode chips can be controlled through an independent circuit of each of the vertical light-emitting diode chips of red, green, and blue in the single pixel to achieve the needs of a full-color pixel, which can be applied to a LED display.

BRIEF DESCRIPTION OF THE DRAWINGS

FIG. 4 is a schematic view of surface structure blacking according to present invention.

FIGS. 7, 8, 9, and 10 are schematic views of relative positions of a vertical light-emitting diode chip and a conductive column according to present invention.

DETAILED DESCRIPTION OF THE PREFERRED EMBODIMENTS

The detailed description and technical content of the invention are described below with reference to the accompanying drawings.

Figure 1A:
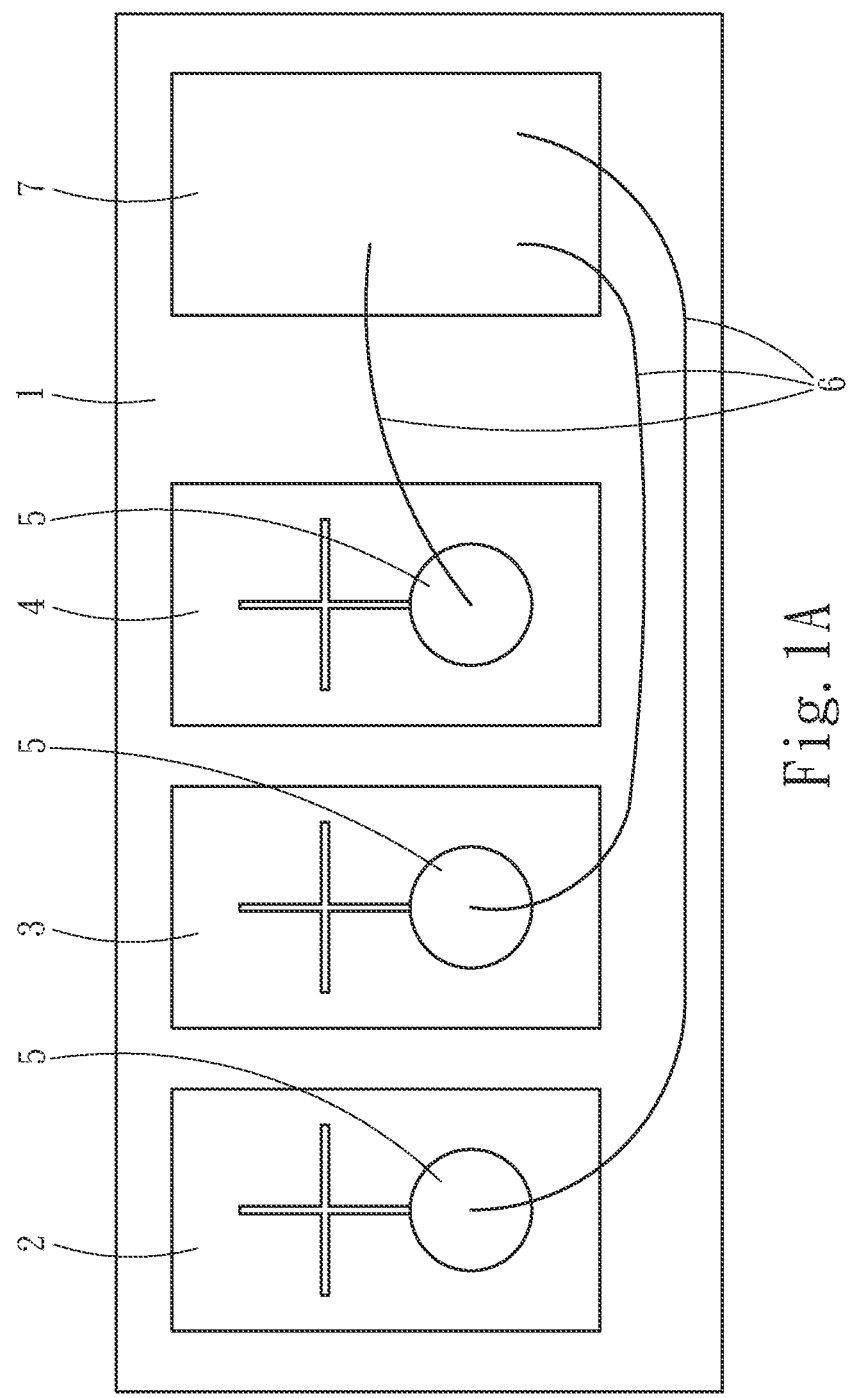
FIG. 1A is a schematic top view of a wire bonding structure of a conventional vertical LED.
Figure 1B:
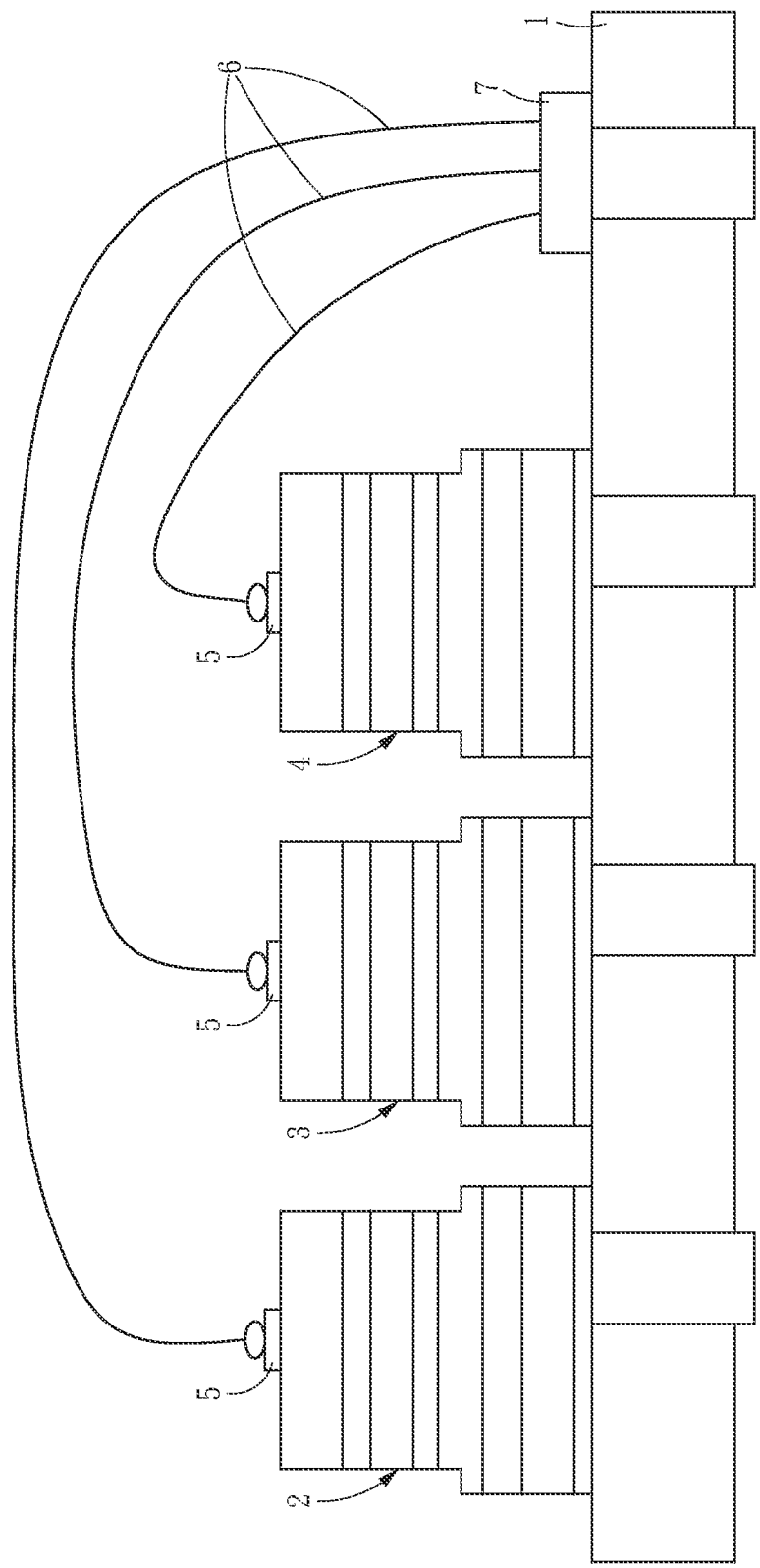
FIG. 1B is a schematic sectional side view of a wire bonding structure of a conventional vertical LED.
Figure 2A:
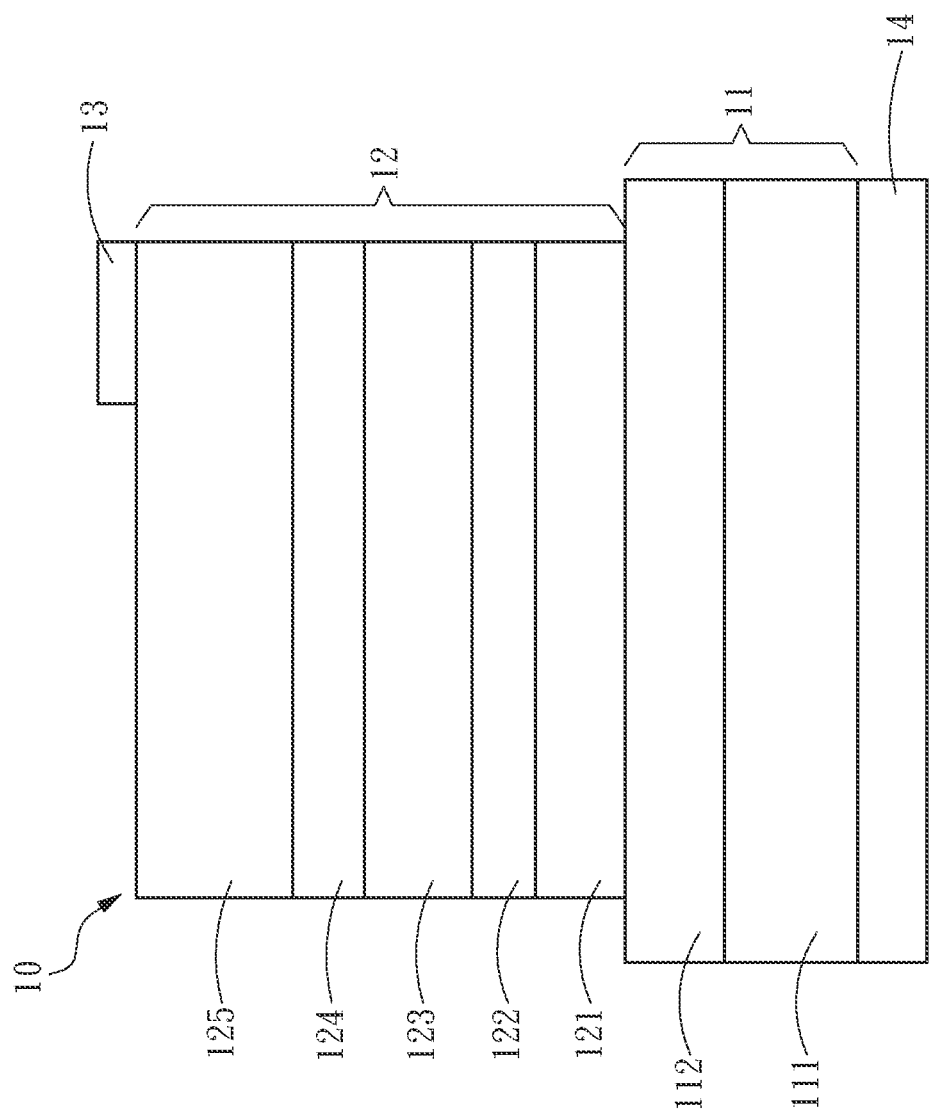
FIG. 2A is a schematic structure sectional view of a vertical light-emitting diode chip according to present invention.
Figure 2B:
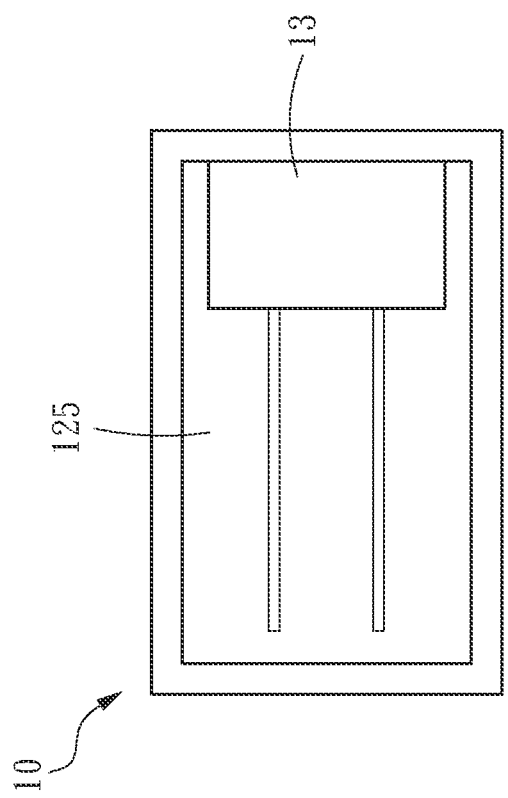
FIG. 2B is a schematic top structure view of a of a vertical light-emitting diode chip according to present invention.

Referring to the depiction of FIGS. 2A and 2B, a schematic structure sectional view and schematic top structure view of a vertical light-emitting diode chip 10 according to present invention are shown. In an embodiment, the vertical light-emitting diode chip 10 according to present invention includes a conductive carrier 11, a vertical light-emitting diode structure 12, a N electrode 13, and a P electrode 14. The vertical light-emitting diode structure 12 is fixed on the conductive carrier 11, the N electrode 13 is electrically connected to an upper part of the vertical light-emitting diode structure 12, and the P electrode 14 is electrically connected to a lower part of the conductive carrier 11. In an embodiment, the conductive carrier 11 includes an alternative substrate 111 and an adhesive layer 112 sequentially stacked, the alternative substrate 111 is made from a substance with high thermal conductivity and electrical conductivity, such as a silicon substrate, etc. The vertical light-emitting diode structure 12 includes a structure metal layer 121, a conductive reflection layer 122, a P-type semiconductor layer 123, a light-emitting layer 124, and a N-type semiconductor layer 125 sequentially stacked. The adhesive layer 112 is adhered to the structure metal layer 121 to fix the vertical light-emitting diode structure 12 on the conductive carrier 11. The N electrode 13 is electrically connected to the N-type semiconductor layer 125 through an ohmic contact, and the P electrode 14 is electrically connected to the alternative substrate 111, to conduct with the P-type semiconductor layer 123. Accordingly, a voltage is applied to the N electrode 13 and the P electrode 14, and a voltage difference is generated between the P-type semiconductor layer 123 and the N-type semiconductor layer 125 to drive the light-emitting layer 124 to emit light. By changing epitaxial materials used in the light-emitting layer 124, the light-emitting layer 124 emits red light, green light, and blue light. Preferably, the N electrode 13 of the vertical light-emitting diode chip 10 of the present invention is placed on a side of the vertical light-emitting diode chip 10.

Referring again to FIGS. 3A and 3B, as shown, a common cathode electrode structure for a vertical light-emitting diode pixel package is proposed in the present invention, including a plurality of the vertical light-emitting diode chips 10, a conductive column 20, an insulating isolation support 30, a common cathode metal thin film layer 40 and a package carrier 50.

The package carrier 50 includes a plurality of anodes 51 and a common cathode 52, the plurality of anodes 51 and the common cathode 52 penetrate through the package carrier 50, respectively. The plurality of vertical light-emitting diode chips 10 is arranged on the package carrier 50, and the plurality of anodes 51 are respectively corresponded and electrically connected to the P electrodes 14 of the plurality of vertical light-emitting diode chips 10. In an embodiment, the package carrier 50 is rectangular with an area between 0.04 mm$^2$ and 1.96 mm$^2$; alternatively, the package carrier 50 is square with side lengths in a range of 0.20 mm*0.20 mm to 1.4 mm*1.4 mm.

The conductive column 20 is arranged on the package carrier 50 and is electrically connected to the common cathode 52, and a common plane 211 is formed between the N electrodes 13 of the plurality of vertical light-emitting diode chips 10 and an upper contact surface 21 of the conductive column 20. The conductive column 20 is preferably made from substances such as tin, copper, gold, aluminum, and the like, or either a high conductivity semiconductor substance, such as an N-type semiconductor, a P-type semiconductor, or an ITO, etc.

Figure 3A:
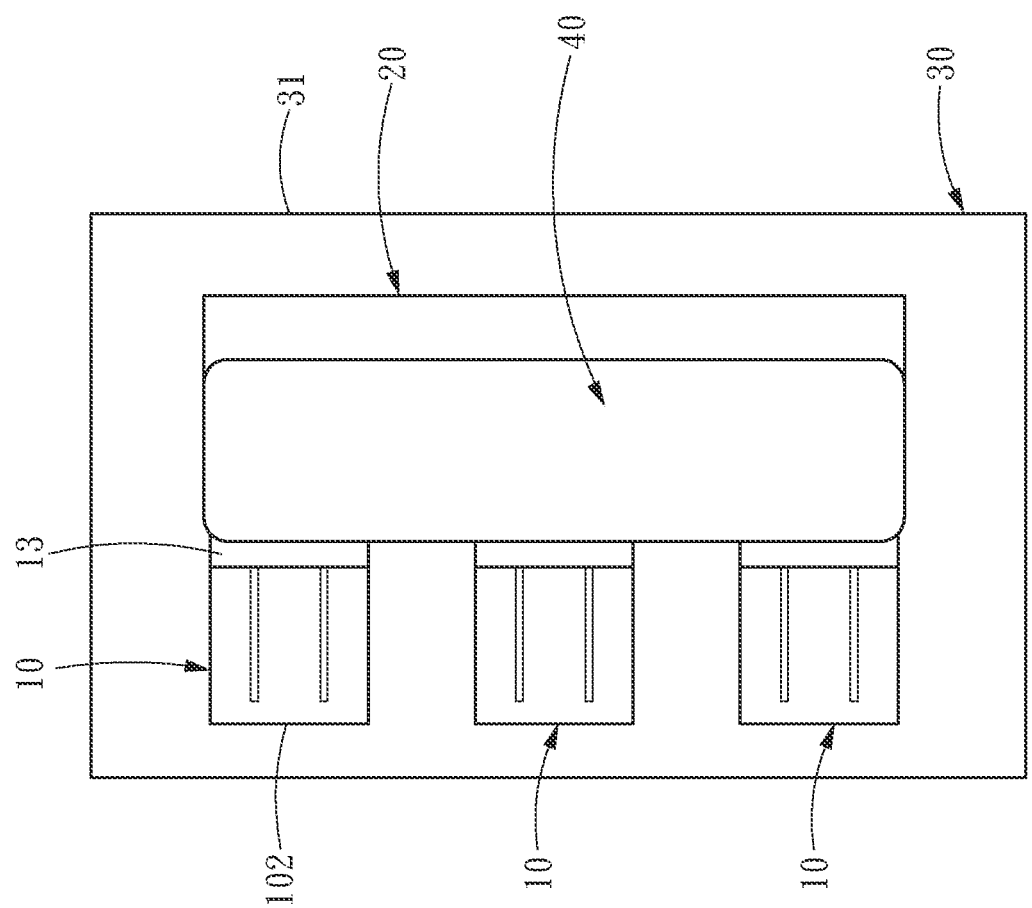
FIG. 3A is a schematic top view of a structure according to present invention.
Figure 3B:
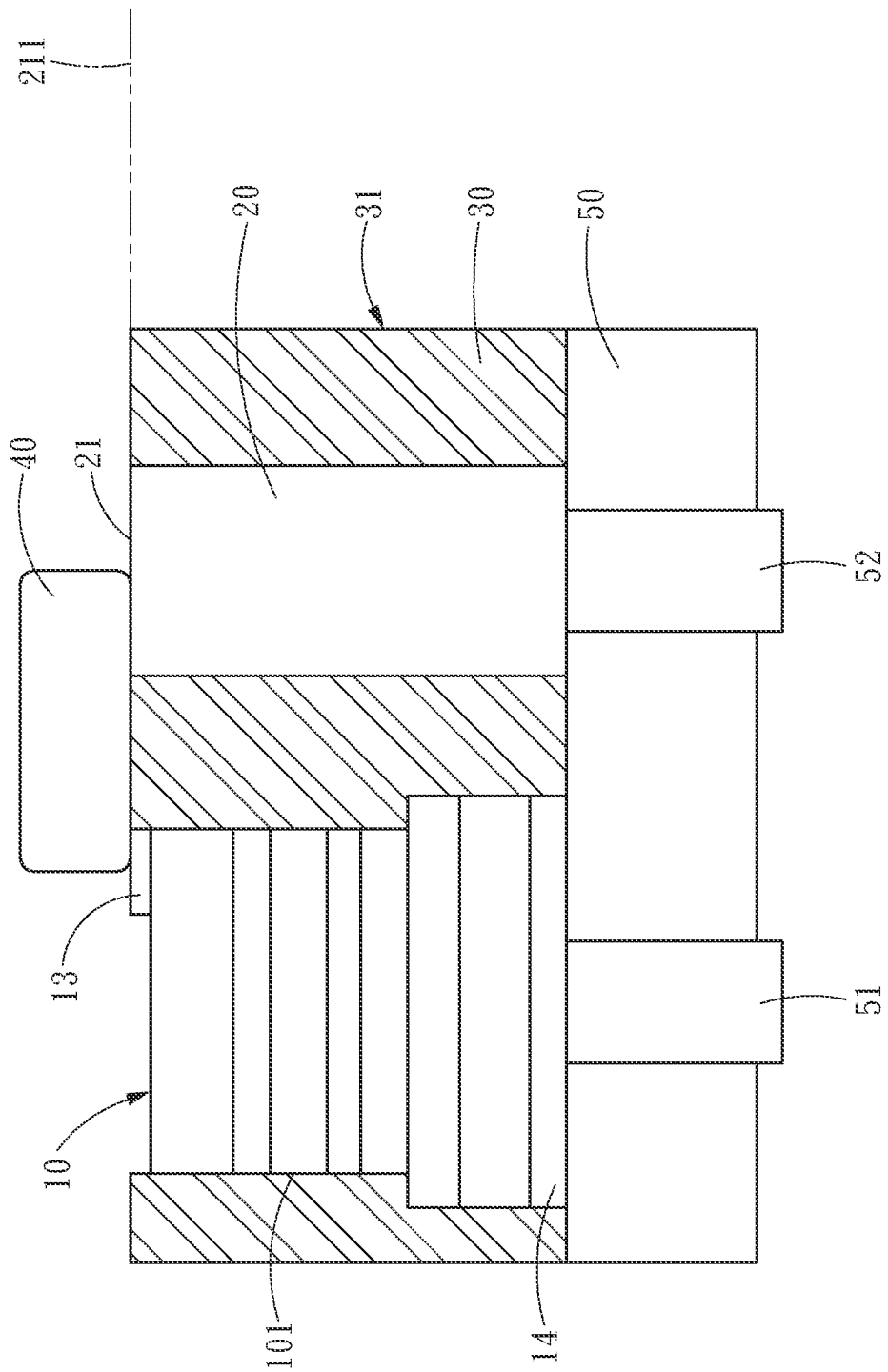
FIG. 3B is a schematic sectional view of a structure according to present invention.

The insulating isolation support 30 is arranged on the package carrier 50 and filled between the conductive column 20 and the plurality of vertical light-emitting diode chips 10 and flushed with the common plane 211, as shown in FIG. 3B. Furthermore, the insulating isolation support 30 covers a side wall 101 of the plurality of vertical light-emitting diode chips 10. Preferably, the insulating isolation support 30 further surrounds the conductive column 20 and the plurality of vertical light-emitting diode chips 10 to form a structure body 31 to enhance overall structural strength. Material of the insulating isolation support 30 is selected from any one of epoxy, silicon, and the like.

The common cathode metal thin film layer 40 is formed on the N electrodes 13 of the plurality of vertical light-emitting diode chips 10, the conductive column 20, and the insulating isolation support 30, and the common cathode metal thin film layer 40 is electrically conducted with the conductive column 20 and the N electrodes 13 of the plurality of vertical light-emitting diode chips 10. In an embodiment, the common cathode metal thin film layer 40 is manufactured by any one of a screen-printed method, a gluing method, and a deposition method, and a thickness of the common cathode metal thin film layer 40 is at least 3 microns, wherein the screen-printed is a conductive colloid, and the conductive colloid is a mixed material of a colloid and a high electrical conductivity metal such as tin, copper, silver, gold, etc.

Referring to FIGS. 3A and 4, as shown, in an embodiment, the insulating isolation support 30 is made of a black substance. In an embodiment, a black insulating substance 60 is screen printed above the insulating isolation support 30 to cover the common cathode metal thin film layer 40, the N electrode 13, and the conductive column 20 to expose light exit regions 102 of the plurality of vertical light-emitting diode chips 10. More specifically, only the light exit regions 102 of the plurality of vertical light-emitting diode chips 10 are not covered by the black insulating substance 60 so that a reflection of light from metal can be avoided to improve a contrast ratio. In an embodiment, the insulating isolation support 30 can be implemented by a black substance together with the black insulating substance 60 screen printed to achieve the contrast ratio preferably.

Figure 5A:
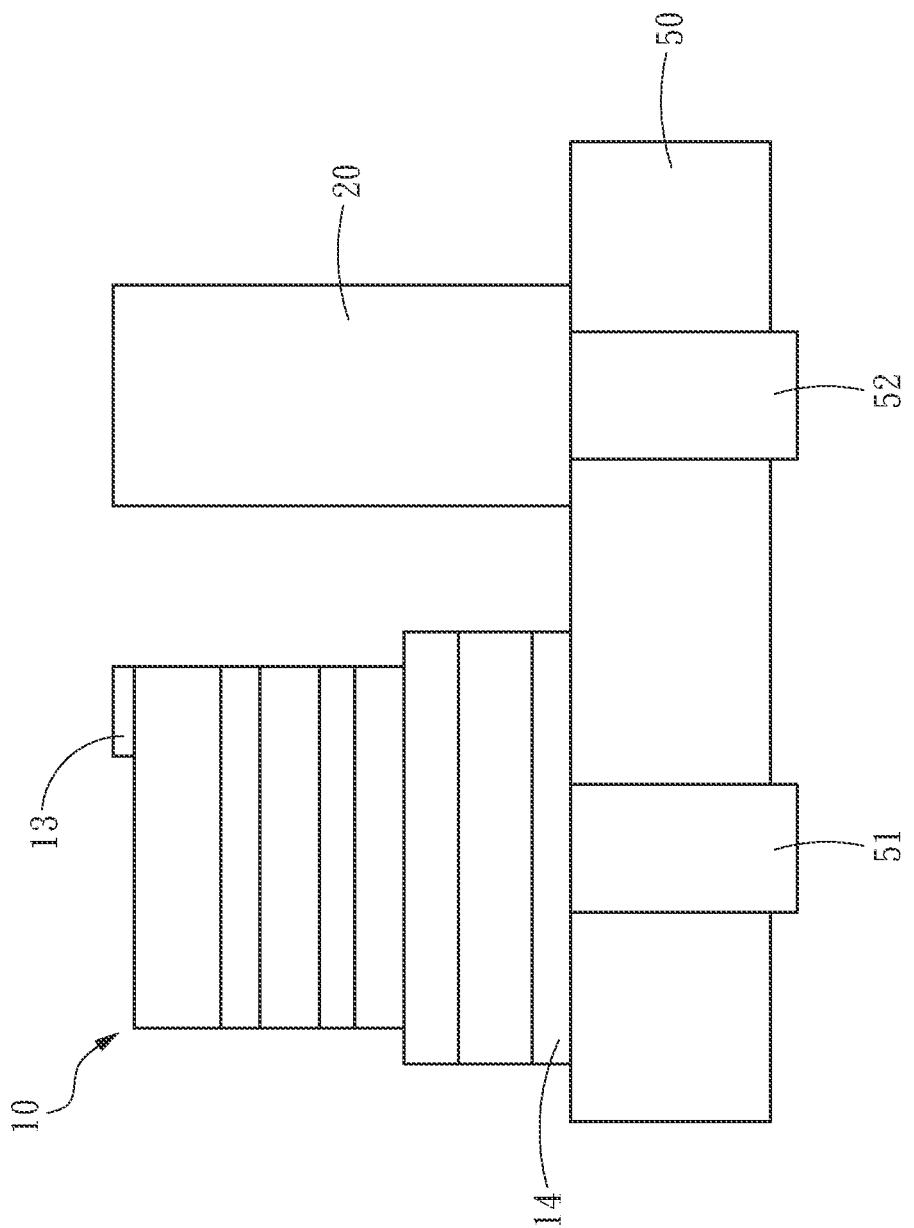
FIGS. 5A-5D are structure sectional views of a manufacturing flow according to present invention.
Figure 5B:
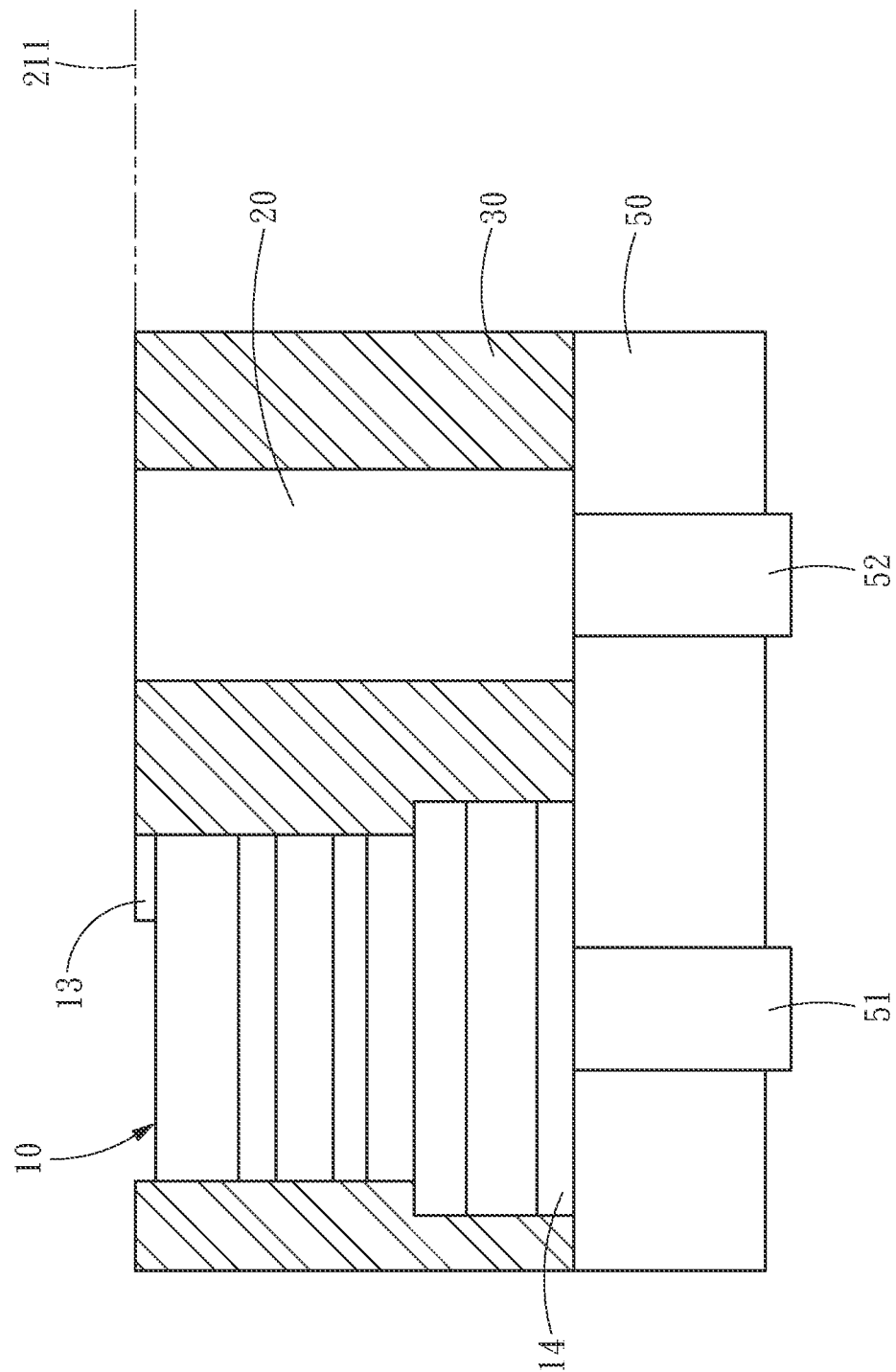
Figure 5C:
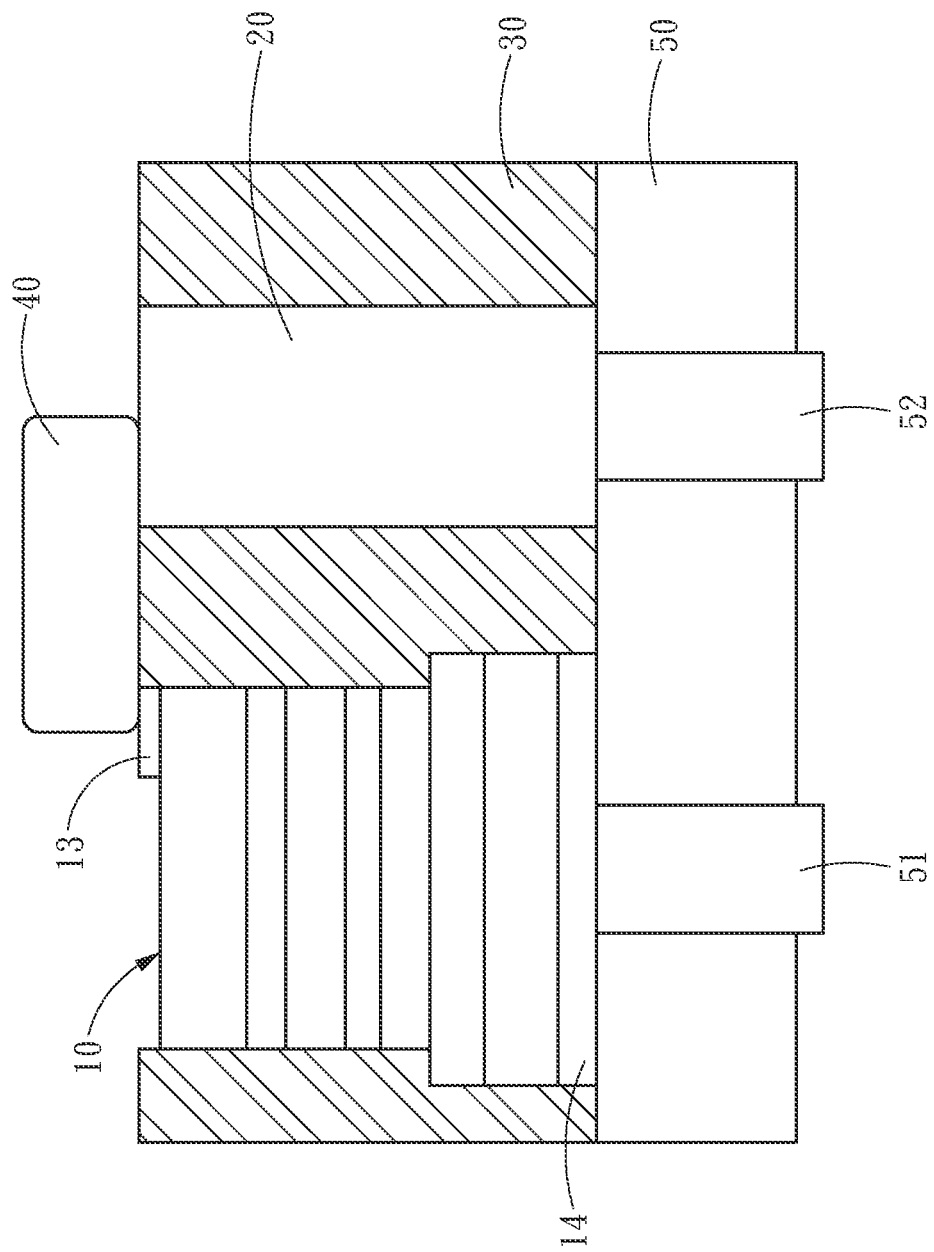
Figure 5D:
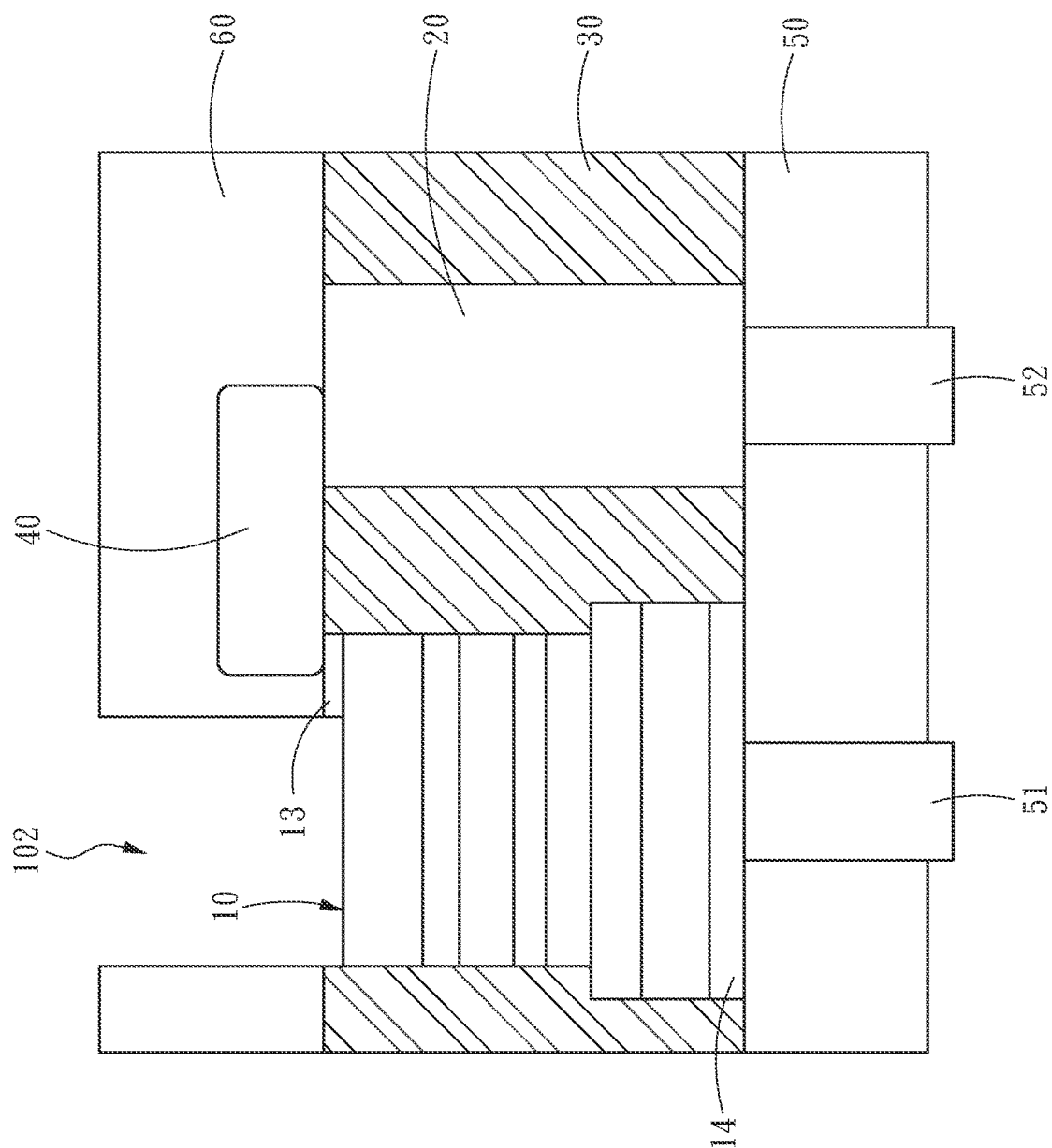

Referring to FIGS. 5A, 5B, 5C and 5D together, in a manufacturing process, in an embodiment, initially, the plurality of vertical light-emitting diode chips 10 and the conductive column 20 are fixed to the package carrier 50, the plurality of anodes 51 are electrically connected to a plurality of P electrodes 14, and the common cathode 52 is electrically connected to the conductive column 20. Subsequently, as shown in FIG. 5B, the insulating isolation support 30 is filled between the conductive column 20 and the plurality of vertical light-emitting diode chips 10 and flushed with the common plane 211, and the insulating isolation support 30 is manufactured by any one of a gluing method, a spray coating method, and a vacuum perfusion method. Subsequently, as shown in FIG. 5C, the common cathode metal thin film layer 40 is formed on the plurality of vertical light-emitting diode chips 10, the conductive column 20, and the insulating isolation support 30, and the common cathode metal thin film layer 40 electrically conduct with the conductive column 20 and the N electrodes 13 of the plurality of vertical light-emitting diode chips 10. Last, as shown in FIG. 5D, the black insulating substance 60 is screen printed above the common cathode metal thin film layer 40, the N electrode 13, the conductive column 20, and the insulating isolation support 30 and exposes the light exit region 102.

Figure 6A:
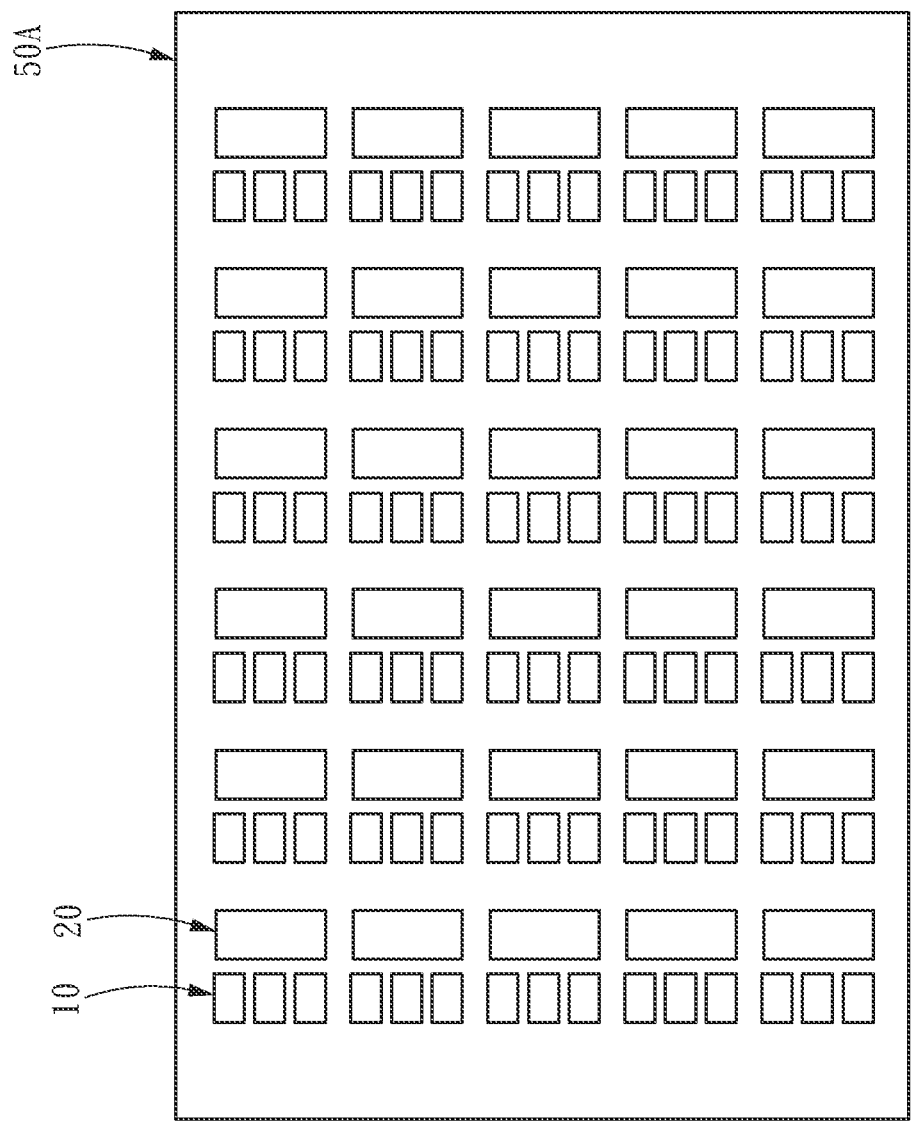
FIG. 6A is a first schematic view of manufacturing process according to present invention.
Figure 6B:
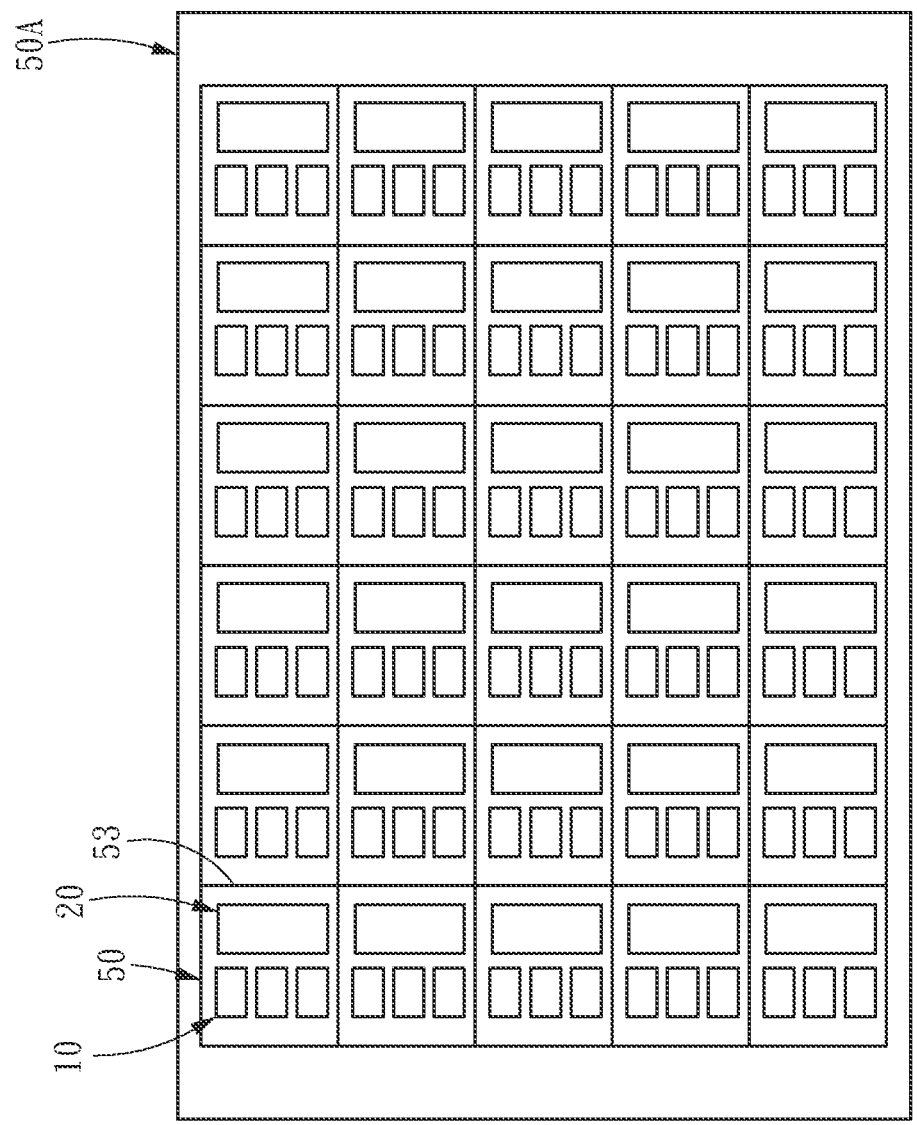
FIG. 6B is a second schematic view of manufacturing process according to present invention.

Referring to FIGS. 6A and 6B together, in an embodiment, multiple sets of the plurality of vertical light-emitting diode chips 10 and the conductive column 20 are arranged on a large package carrier 50A in advance, according to the structure described in the present invention, to meet the needs for mass production. The large package carrier 50A is an aggregate of the plurality of the package carrier 50, after a manufacturing process for screen printing the black insulating substance 60 (referring to FIG. 5D) is completed, and the large package carrier 50A is cut along the cutting line 53 so that the large package carrier 50A is split into a plurality of package carrier 50.

Figure 7:
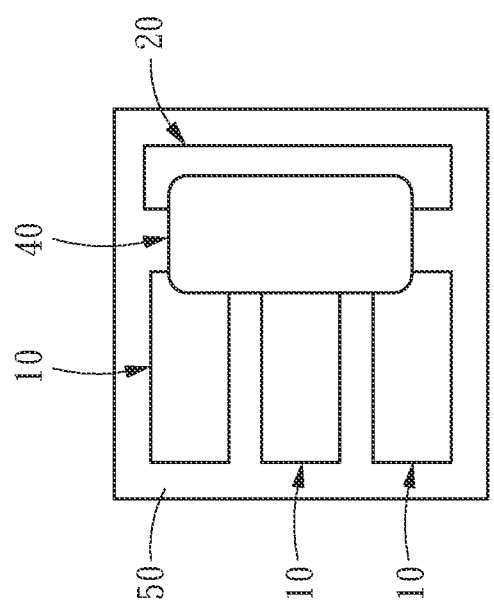

Referring to FIG. 7, in an embodiment, a number of the plurality of vertical light-emitting diode chips 10 on the package carrier 50 is three, the plurality of vertical light-emitting diode chips 10 are rectangular viewed from a top, and the conductive column 20 is also rectangular viewed from the top. The three vertical light-emitting diode chips 10 emit red light, green light and blue light, respectively. The three vertical light-emitting diode chips 10 are arranged side by side with long sides adjacent, and a long side of the conductive column 20 is close to short sides of the three vertical light-emitting diode chips 10. Furthermore, the conductive column 20 and the three vertical light-emitting diode chips 10 are electrically conducted by the common cathode metal thin film layer 40.

Figure 8:
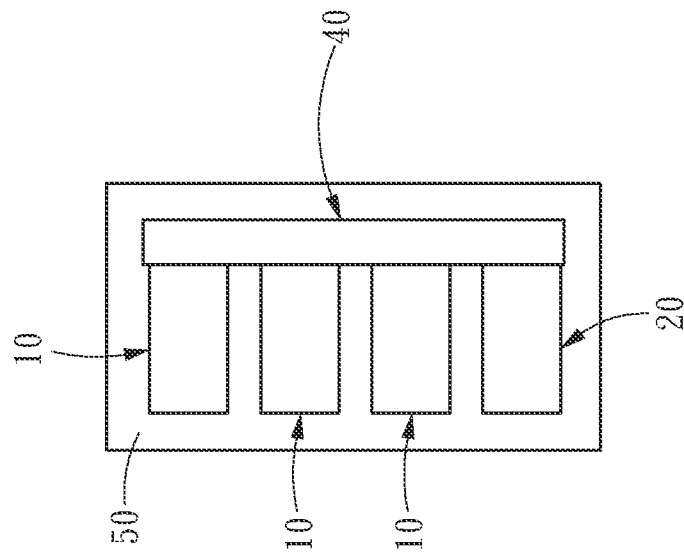

Referring to FIG. 8, in an embodiment, a number of the plurality of vertical light-emitting diode chips 10 on the package carrier 50 is three, the plurality of vertical light-emitting diode chips 10 are rectangular viewed from the top, with the conductive column 20 is also rectangular viewed from the top. The three vertical light-emitting diode chips 10 emit red light, green light and blue light, respectively. Furthermore, the three vertical light-emitting diode chips 10 and the conductive column 20 are arranged side by side with long sides adjacent. Furthermore, the conductive column 20 and the three vertical light-emitting diode chips 10 are electrically conducted by the common cathode metal thin film layer 40.

Referring to FIG. 9, in an embodiment, a number of the plurality of vertical light-emitting diode chips 10 on the package carrier 50 is three, the plurality of vertical light-emitting diode chips 10 are rectangular viewed from the top, and the conductive column 20 is also rectangular viewed from the top. The three vertical light-emitting diode chips 10 emit red light, green light and blue light, respectively. Furthermore, the three vertical light-emitting diode chips 10 and the conductive column 20 are arranged in a 2*2 matrix. Furthermore, the conductive column 20 and the three vertical light-emitting diode chips 10 are electrically conducted by the common cathode metal thin film layer 40.

Figure 10:
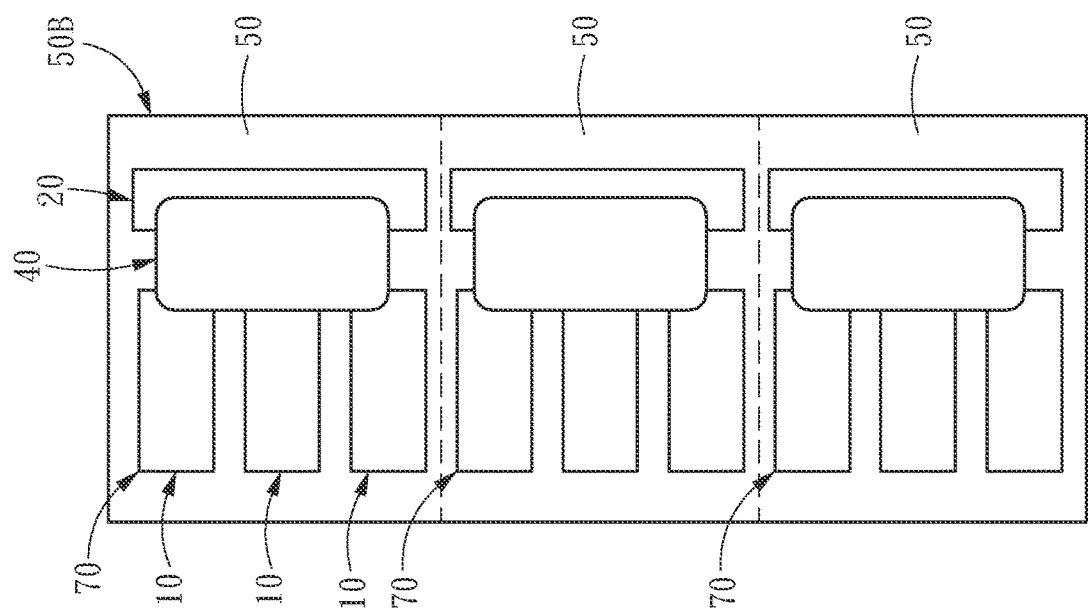

Referring to FIG. 10, in order to simplify a subsequent manufacturing process and increase mass production speed of a subsequent manufacturing process, multiple pixels 70 are arranged on one pixel carrier 50B. In more detail, the one pixel carrier 50B is a combination of a plurality of package carrier 50 without dividing. In an embodiment, multiple conductive columns 20 and multiple common cathode metal thin film layers 40 are provided, and the multiple conductive columns 20 and the multiple common cathode metal thin film layers 40 are deployed in a one-to-one manner and are respectively coordinated with three vertical light-emitting diode chips 10 (which respectively emit red light, green light and blue light) to form the multiple pixels 70 to be arranged on the one pixel carrier 50B.

As described above, the characteristics of the present invention include at least:

1. According to present invention, the plurality of N electrode are electrically connected to the common cathode of the package carrier, and the plurality of P electrodes are electrically connected to the plurality of anodes of the package carrier respectively by arranging the common cathode metal thin film layer and the conductive column, the plurality of anodes and the common cathode are in the same plane to meet requirements of mainstream SMT packaging technology.

2. The present invention proposes a design of a common cathode. A single pixel constituted by the three vertical light-emitting diode chips emitting red light, green light and blue light, respectively, a luminous intensity of each of the three vertical light-emitting diode chips is controlled through an independent circuit of each of the three vertical light emitting diode chips in the single pixel to achieve the needs of a full-color pixel applied to a LED display.

3. The plurality of vertical light-emitting diode chips of the present invention is a vertical LED chip avoids a risk of short circuits and increases reliability compared to conventional vertical LED chips; Meanwhile, the present invention meets requirements of mass production of MiniLED Display with high image quality and high contrast.

4. Multiple sets of the plurality of vertical light-emitting diode chips and the conductive column are arranged on the large package carrier in advance according to the structure described in the present invention, the large package carrier is cut after the manufacturing process for printing the black insulating substance is completed, and options of one carrier with one pixel or one carrier with multi pixel are provided, so as to meet the needs of mass production and simplifying the use of a subsequent manufacturing process.

What is claimed is:

1. A common cathode electrode structure for a vertical light-emitting diode pixel package, comprising:

a package carrier comprising a plurality of anodes and a common cathode, and the plurality of anodes and the common cathode respectively penetrating through the package carrier;

a plurality of vertical light-emitting diode chips arranged on the package carrier, the plurality of vertical light-emitting diode chips respectively comprising a conductive carrier, a vertical light-emitting diode structure fixed on the conductive carrier, an N electrode electrically connected to an upper part of the vertical light-emitting diode structure, and a P electrode electrically connected to a lower part of the conductive carrier, the plurality of anodes respectively corresponded and electrically connected to the P electrodes of the plurality of vertical light-emitting diode chips;

a conductive column arranged on the package carrier and electrically connected to the common cathode, and a common plane is formed between the N electrodes of the plurality of vertical light-emitting diode chips and an upper contact surface of the conductive column;

an insulating isolation support arranged on the package carrier and filled between the conductive column and the plurality of vertical light-emitting diode chips and flushed with the common plane, the insulating isolation support covering a side wall of the plurality of vertical light-emitting diode chips; and a common cathode metal thin film layer formed on the N electrodes of the plurality of vertical light-emitting diode chips, the conductive column, and the insulating isolation support, and the common cathode metal thin film layer is electrically conducted with the conductive column and the N electrodes of the plurality of vertical light-emitting diode chips.

2. The common cathode electrode structure of claim 1, wherein the insulating isolation support is made of a black substance.

3. The common cathode electrode structure of claim 1, wherein a black insulating substance is screen printed above the insulating isolation support to cover the common cathode metal thin film layer, the N electrode, and the conductive column and exposes light exit regions of the plurality of vertical light-emitting diode chips.

4. The common cathode electrode structure of claim 1, wherein the insulating isolation support is made of a black substance, a black insulating substance is screen printed above the insulating isolation support to cover the common cathode metal thin film layer, the N electrode, and the conductive column and exposes light exit regions of the plurality of vertical light-emitting diode chips being exposed.

5. The common cathode electrode structure of claim 1, wherein a number of the plurality of vertical light-emitting diode chips is three, the three vertical light-emitting diode chips are rectangular viewed from a top, the conductive column is rectangular viewed from the top, the three vertical light-emitting diode chips emit red light, green light and blue light respectively, the three vertical light-emitting diode chips are arranged side by side with long sides adjacent, and a long side of the conductive column is close to short sides of the three vertical light-emitting diode chips.

6. The common cathode electrode structure of claim 1, wherein a number of the plurality of vertical light-emitting diode chips is three, the three vertical light-emitting diode chips are rectangular viewed from a top, the conductive column is rectangular viewed from the top, the three vertical light-emitting diode chips emit red light, green light and blue light, respectively, and the three vertical light-emitting diode chips and the conductive column are arranged side by side with long sides adjacent.

7. The common cathode electrode structure of claim 1, wherein a number of the plurality of vertical light-emitting diode chips is three, the three vertical light-emitting diode chips are rectangular viewed from a top, the conductive column is rectangular viewed from the top, the three vertical light-emitting diode chips emit red light, green light and blue light, respectively, and the three vertical light-emitting diode chips and the conductive column are arranged in a 2*2 matrix.

8. The common cathode electrode structure of claim 1, wherein multiple conductive columns and multiple common cathode metal thin film layers are provided, and the multiple conductive columns and the multiple common cathode metal thin film layers are deployed in a one-to-one manner and are respectively coordinated with three vertical light-emitting diode chips respectively emitting red light, green light and blue light to form a plurality of multiple pixels to be arranged on the package carrier.

9. The common cathode electrode structure of claim 1, wherein the package carrier is rectangular with an area in a range between 0.04 mm$^2$ and 1.96 mm$^2$.

10. The common cathode electrode structure of claim 1, wherein the common cathode metal thin film layer is manufactured by any one of a screen-printed method, a gluing method, and a deposition method.

11. The common cathode electrode structure of claim 1, wherein a thickness of the common cathode metal thin film layer is at least 3 microns.

12. The common cathode electrode structure of claim 1, wherein the insulating isolation support is manufactured by any one of a gluing method, a spray coating method, and a vacuum perfusion method.

* * * * *